United States Patent [19]

Roberts

[11] 3,918,149

[45] Nov. 11, 1975

[54] AL/SI METALLIZATION PROCESS

[75] Inventor: Gary Roberts, Mountain View, Calif.

[73] Assignee: Intel Corporation, Santa Clara, Calif.

[22] Filed: June 28, 1974

[21] Appl. No.: 484,071

[52] U.S. Cl. ...................... 29/580; 29/590; 29/591; 204/192

[51] Int. Cl.² ........................................ B01J 17/00

[58] Field of Search ............. 29/589, 590, 591, 580, 29/578; 204/192; 156/17

[56] References Cited

UNITED STATES PATENTS

| | | | |
|---|---|---|---|
| 3,523,223 | 8/1970 | Luxens | 29/580 |
| 3,740,835 | 6/1973 | Duncan | 29/590 |
| 3,816,198 | 6/1974 | La Combe | 156/17 |

*Primary Examiner*—W. Tupman

[57] ABSTRACT

An improved method for the manufacture of semiconductor devices which inhibits the dissolution of substrate silicon from the area of the substrate exposed by a contact window. Two individual layers are disposed on a protective insulative layer such as silicon dioxide which is itself disposed upon a semiconductor wafer. The first layer on the insulating layer is silicon and the second is aluminum. The improvement consists of forming these two layers in specific amounts and with high precision. An aluminum interconnect pattern is then defined using standard photomask and aluminum etch techniques. In a separate step, the silicon is etched using plasma etching techniques. The remaining Al/Si layers are homogenized into an alloy to form the ohmic contacts by heating the wafer in a furnace at high temperatures.

7 Claims, 4 Drawing Figures

AL/SI METALLIZATION PROCESS

BACKGROUND OF THE INVENTION

1. Field of the Invention

This invention relates to an improved metallization process for the production of semiconductor devices.

2. Prior Art

In the manufacture of semiconductor devices and integrated circuits, it is frequently desired to establish interconnections between two parts of an integrated circuit by means of a conductive layer making contact to the parts to be interconnected. In the past, this conducting layer often has a portion which overlies a protective insulating layer and makes contact through apertures in the insulator material (e.g., silicon dioxide, silicon nitride, ethyl silicate). These apertures, referred to as "contact windows," are used to define the contacts with the regions in the substrate such as the source or drain regions in MOS devices. To accomplish this, the prior art vacuum evaporated or otherwise deposited a conductive layer (e.g., aluminum) onto an insulating layer. The integrated circuit was heated in a furnace to cause proper contact between the conductive layer and the underlying circuit through the contact windows, and then photoengraved to leave the desired pattern of conductors. The problem associated with this prior art process is that where the conductive layer and the silicon substrate joined, silicon would dissolve from the source or drain region into the conductive layer and form an alloy, e.g., Al/Si, when the device was heated. The silicon would not dissolve uniformly, but rather would occur in localized spots referred to as "spikes." If these spikes were deep enough, they would penetrate the underlying diffused regions and the conductive layer would slump into them causing a "short" at these junctions. In LSI circuits where high device packing density required shallow diffused junctions, the spiking problem can become acute.

One prior art method to overcome spiking consists of first evaporating a layer of silicon onto the insulating layer prior to forming the layer of aluminum. The device is first heated and then etched. The problems associated with this prior art method are at least twofold. First, if more silicon than is stoichiometrically required to form an Al/Si alloy by satisfying the solubility requirements of aluminum at a given alloy temperature is deposited over the insulating layer, it will not all be dissolved into the alloy. As a consequence, there will be some silicon left between the aluminum layer and the silicon substrate. This prevents proper electrical connection with the region because of the relatively high resistivity of the silicon. Second, if an insufficient silicon layer is deposited, the amount of silicon necessary to stoichiometrically satisfy the aluminum in formation of an alloy at a given alloy temperature will not be present. As a consequence, additional silicon from the substrate will be used to complete the formation of the Al/Si alloy. Again spiking may take place at points where silicon from the substrate was removed to complete the alloying of the aluminum during the heating step. The prior art attempts to control the amount of the silicon layer were not completely successful inasmuch as it was difficult to control the point where the silicon would be completely removed from the region to form the alloy during the heating step. Any excess evaporated silicon not incorporated into the alloy remains to form electrical shorts between metal lines after etching the aluminum. Further, since the device is heated, the alloy formed becomes super-saturated with silicon. Upon cooling, pure silicon precipitates out of the alloy and forms particles. These particles cause problems when the alloy layer is etched since prior art methods used to etch aluminum are not effective on these silicon particles, while those used to etch silicon are difficult to control and tend to remove the insulative silicon oxide layer.

Recently, the prior art began to etch the conductive layer and silicon layers before heating to reduce the problems associated with these silicon particles. See, for example, the process described in a publication by P. Bellier of the Communications Research Center, Ottawa, Canada, "An Improved Metallization Process for Silicon Transistors," published May 1973. The prior art would first etch away the aluminum coating using standard photomask and aluminum etch techniques. Then the silicon was removed by means of a wet chemical etch technique. However, this wet chemical etch technique cannot be used with all insulative oxide coatings. If the protective coating is porous silicon dioxide glass with phosphorus impurities as described in application Ser. No. 292,510, filed Sept. 27, 1972 (assigned to the assignee of the present application), the coating would be destroyed.

The present invention is directed toward a method to increase the reliability and production of integrated circuit devices by providing a simple, yet effective solution to the aforementioned problems associated with spiking and wet etch techniques.

SUMMARY OF THE INVENTION

The present invention technique is applicable in the fabrication of semiconductor circuits or devices wherein an insulating layer (e.g., silicon dioxide, silicon nitride, etc.) is established on the surface of a body of semiconductor material, for example, see the layer described in application Ser. No. 292,510, filed Sept. 27, 1972, herein incorporated by reference, and assigned to the assignee of the present application. The layer includes apertures therethrough (referred to as a contact window) used to expose portions of the semiconductor surface to which it is desired to establish an electrical contact. The electrical contact is formed by a conductive layer contacting the exposed semiconductor substrate and most often overlying portions of the insulating layer to define interconnections. Briefly, the invention comprises the steps of sequentially evaporating a layer of silicon of a predetermined thickness on the insulating layer followed by a layer of aluminum also of a predetermined thickness. The evaporated silicon layer is placed between the aluminum and the insulative layer to insure that the Al/Si alloy formed during the alloy step uses only evaporated silicon, and that little or no substrate silicon is dissolved from the area of the substrate exposed by the contact window. Thus, the thickness of the silicon layer is chosen to provide just enough silicon to stoichiometrically satisfy the formation of Al/Si alloy at a chosen alloy temperature. After proper evaporation, the aluminum interconnect pattern is defined using the aforementioned prior art photomask and aluminum etch techniques. The evaporated silicon layer is not removed in this process, however. The silicon remaining over the substrate is then removed everywhere but under the aluminum lines by plasma etching with freon gas in a subsequent step with the remaining aluminum layer acting as a mask. The aluminum and silicon layers are then homogenized into an alloy forming ohmic contacts by heating the substrate.

The novel features which are believed to be characteristic of the invention, both as to its organization and method of operation, together with futher objectives and advantages thereof, will be better understood from the following description considered in connection with the accompanying drawing in which a presently preferred embodiment of the invention is illustrated by way of example. It is to be expressly understood, however, that the drawing is for the purpose of illustration and description only and is not intended as a definition of the limits of the invention.

DESCRIPTION OF THE PREFERRED EMBODIMENT

Broadly, the invention involves a method for inhibiting the dissolution of substrate silicon from the area of the substrate exposed by a contact window and into the aluminum metallization during formation of the metal alloy in subsequent high temperature (300°–500°C) processing of the substrate.

Figure 1:
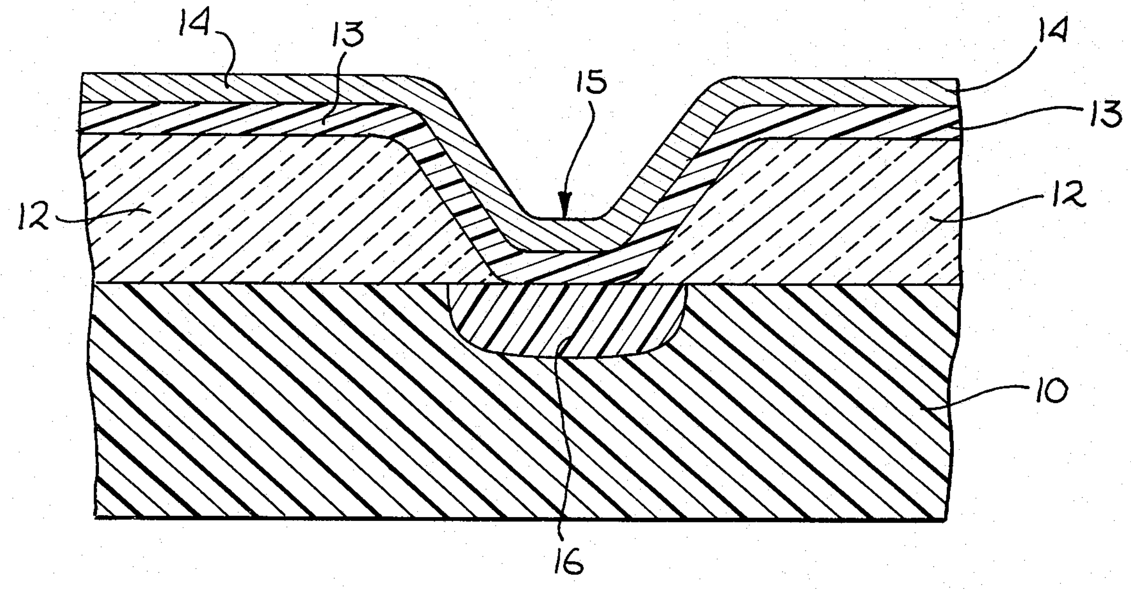
FIG. 1 is a partial cross-sectional view of a silicon substrate with deposited layers thereover.

Referring to FIG. 1, a substrate 10 is illustrated which may be a p-type or n-type substrate such as those commonly utilized to form integrated circuits. In the presently preferred embodiment, the invention is utilized in conjunction with metal-oxide-semiconductor (MOS) technology. In FIG. 1 it is assumed that it is necessary to form a contact such as an ohmic contact with an underlying region in the substrate such as region 16. This region may be a source or drain region such as is associated with a field effect transistor or other region in a substrate. The invention may also be utilized to form contacts with any underlying regions, underlying an oxide layer, such as may be found in a multi-layer device.

In FIG. 1 a contact window is formed by etching the insulating layer 12 utilizing commonly known techniques. The presently preferred insulating layer is silicon oxide. Following this, a silicon layer 13 is deposited over the entire insulative layer 12 by evaporation in the presently preferred embodiment. Following the formation of the silicon layer 13, a conductive layer 14 is evaporated onto the entire surface of the substrate over the silicon layer 13 utilizing commonly known techniques. The presently preferred conductive layer is aluminum, although other metals may be used.

Figure 2:
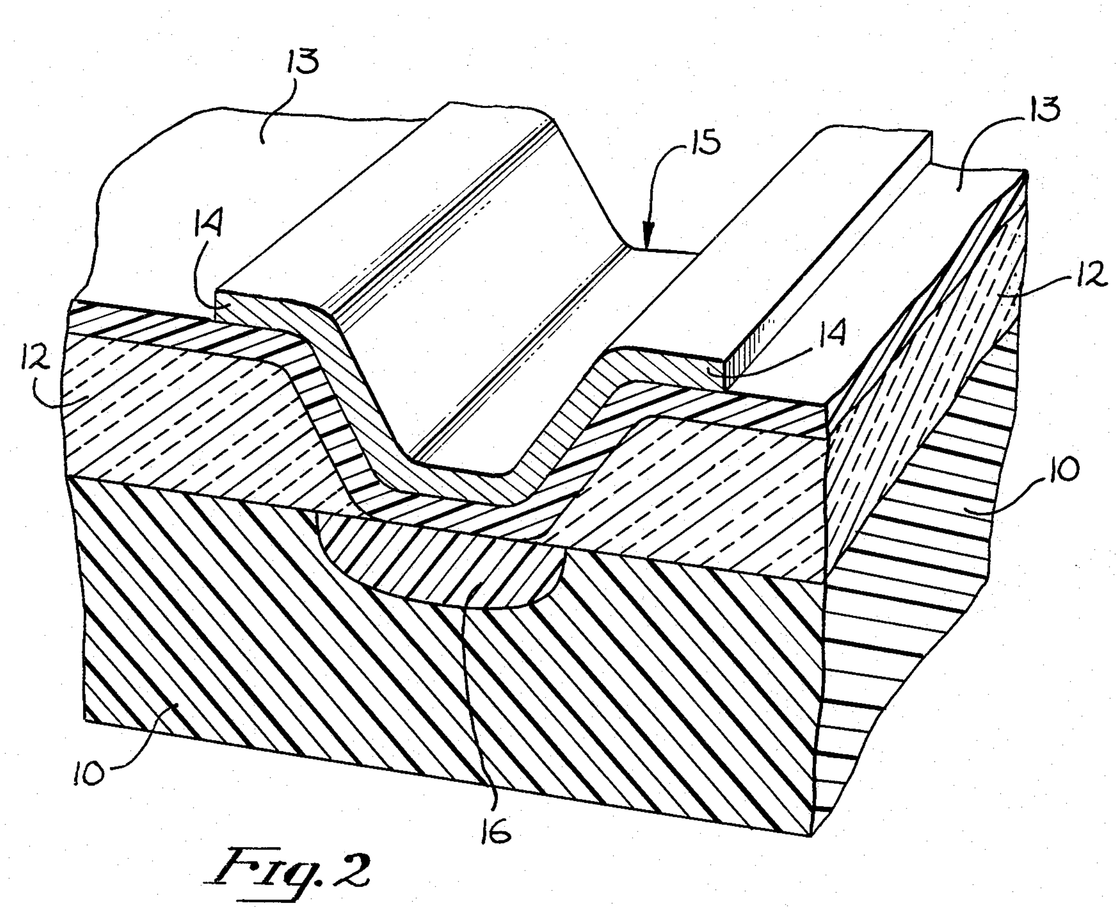
FIG. 2 is a partial cross-sectional view of the silicon substrate shown in perspective after formation of the aluminum interconnect pattern using standard photomask and aluminum etch techniques.

Referring to FIG. 2, in the step of the invention illustrated therein, the aluminum layer 14 is partially removed to define an interconnect pattern by known photomask and aluminum etch techniques. As can be seen from this figure, in this step the silicon layer 13 is not removed by the aluminum etchant.

Figure 3:
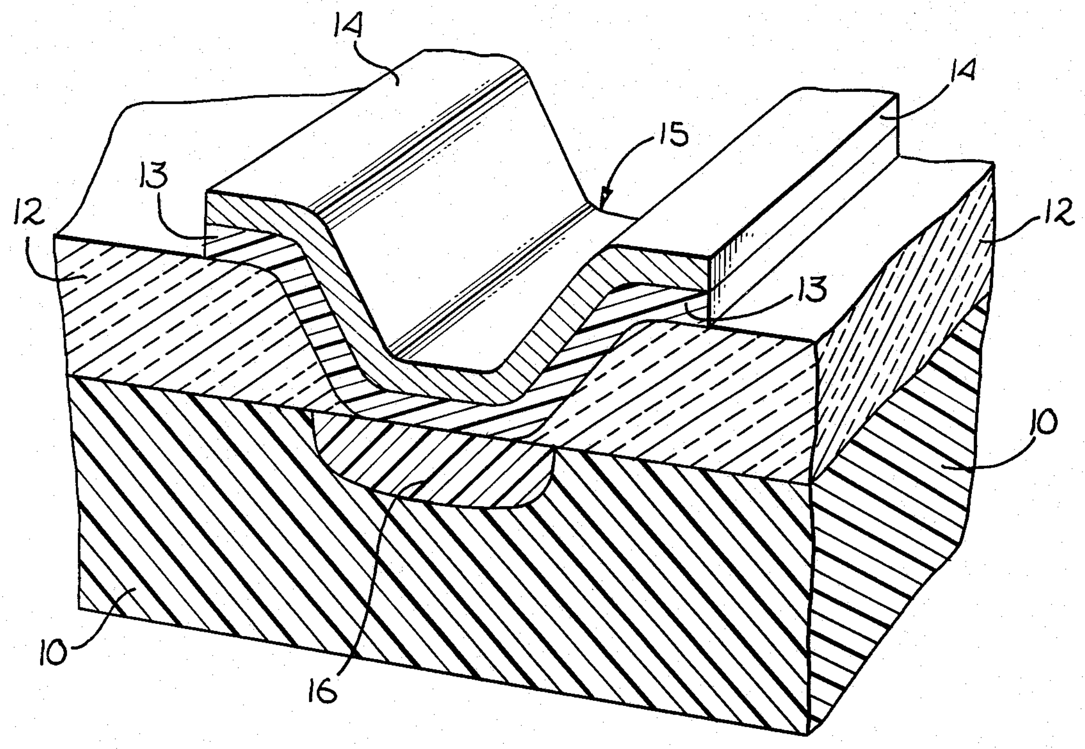
FIG. 3 is a partial cross-sectional view of the silicon substrate shown in perspective after removal of the silicon layer by plasma etching with freon gas.

In FIG. 3 the step of removing the silicon layer is shown. Etching is performed by plasma etching with freon gas. This step is separate and distinct from the removal of the aluminum layer. The overlying aluminum layer 14 is resistant to the freon gas and thus serves as a mask for the underlying silicon. The insulative silicon oxide layer 12 is not removed and prevents undesired contacts with the silicon substrate.

Figure 4:
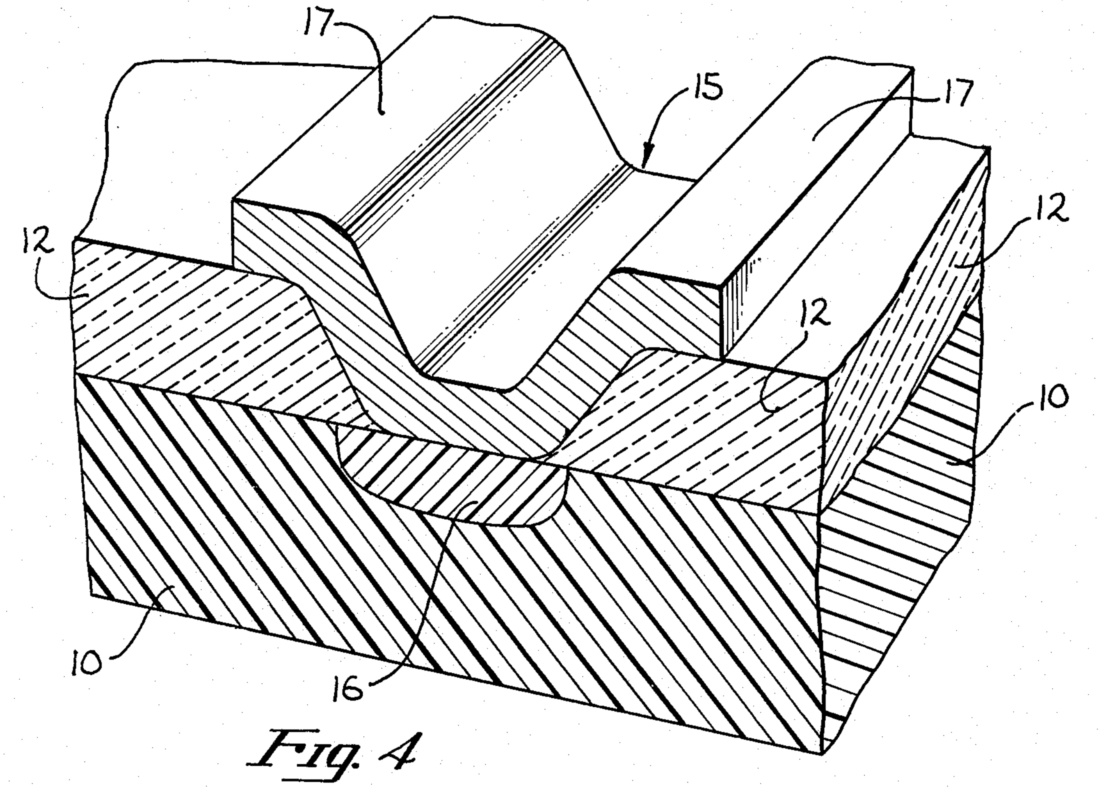
FIG. 4 is a partial cross-sectional view of the silicon substrate after heating the substrate to form the Al/Si alloy.

FIG. 4 shows the silicon substrate 10 after the aluminum and silicon layers are homogenized into Al/Si alloy 17 by heating the substrate in a furnace at approximately 515°C for 10 minutes in the presently preferred embodiment. This step of the inventive process forms the ohmic contacts between a source or drain region, such as region 16 and the now formed conductive alloy layer 17. The insulative layer 12 remains on the substrate through the heat treatment, and thus preserves the integrity of the substrate 10.

In the presently preferred embodiment layers 13 and 14 are deposited onto the insulating layer 12 by a process of sequentially evaporating first a layer of silicon of 125 ± 20A thickness followed by a layer of aluminum of 1.0±.05 $\mu$ thickness using either an electron beam gun with a rotary source or dual electron beam guns (one for silicon and one for aluminum). the evaporated silicon layer is placed between the aluminum and the substrate to insure that the Al/Si alloy formed during the alloy steps uses only evaporated silicon and that little or no substrate silicon is dissolved out through the contact window area 15 into the metal alloy. The thickness of the silicon layer is chosen to produce just enough silicon to saturate the aluminum at the alloy temperature (515°C). However, it is presently preferred to choose the amount of silicon in layer 14 to be less than necessary for complete formation of the alloy, rather than have any silicon remain in region 16 inasmuch as silicon has high resistivity and would prevent proper contact between the conductive layer and the underlying region. If insufficient silicon is deposited in layer 14, relatively small pits may occur in the substrate at the region 16. These small pits do not have an adverse effect on the contact to be formed in region 16 as does too much silicon. Film thicknesses are controlled during each evaporation by providing for direct measurement of both the silicon and aluminum film thicknesses. Reference to metallurgical handbooks will indicate the approximate amount of silicon necessary to form an alloy with a given metal at a given temperature. This allows for the rigid control of the Al/Si ratio necessary for the subsequent formation of the alloy. Evaporation rates are also important in minimizing the partial oxidation of the silicon and aluminum films during evaporation. Incorporation of oxides in the films increase contact resistance. Acceptable contact resistance has consistently been obtained with the following approximate rates and pressures during evaporation.

Si evaporation rate $\geq$ 5A/sec.
Si evaporation pressure $\leq 3 \times 10^{-6}$ torr.
Al evaporation rate $\geq$ 28A/sec.
Al evaporation pressure $\leq 8 \times 10^{-6}$ torr.

Compared with pure aluminum, the Al/Si alloy which is formed in the alloy step subsequent to evaporation, has a reduced ability to dissolve oxides and other contaminants which accumulate at the contact window 15 during the time between pre-evaporation cleaning and silicon and aluminum evaporation. In order to assure the formation of low resistance contact, care must be taken to minimize this oxide and contaminant buildup. As a consequence, the time between preevaporation cleaning and placing the substrate into the vacuum system should be less than 5 minutes. The time for pumping the vacuum system down to $2 \times 10^{-6}$ torr. and beginning the evaporation should be less than 30 minutes. The metal ohmic contact resistance which is obtained with the above Al/Si metallization process is comparable to that of pure aluminum for both <100> and <111> silicon. Typical resistance for a $6 \times 6\ \mu$ contact area is 15 Ω.

The presently preferred embodiment of the present invention uses a porous silicon dioxide with phosphorus impurities as the insulating layer 12 described in application Ser. No. 292,510, filed Sept. 27, 1972 and herein incorporated by reference. However, this coating is attacked by the aforementioned prior art wet etch techniques. To overcome this prior art problem, the present invention removes the silicon layer everywhere except under the aluminum lines, as seen in FIG. 3, by plasma etching with freon gas. The overlying aluminum lines 14 are resistant to the freon gas and thus serve as an etch mask for the underlying silicon. The silicon dioxide insulating layer 12 is also resistant to this etch technique which prevents shorting out of the device caused by a conducting layer slumping into undesired etches in the insulating layer. The Al/Si ratio defined at evaporation is thus preserved while defining the metallization pattern.

While the invention has been described in its preferred embodiments, it is to be understood that the words which have been used are words of description rather than of limitation and that changes within the purview of the appended claims may be made without departure from the true scope and spirit of the invention in its broader aspects.

I claim:

1. A method for forming a contact to a region in a semiconductor substrate through an insulating layer comprising the steps of:

a. forming a contact window in the insulating layer;
b. depositing a layer of silicon over the insulating layer;
c. depositing a conductive layer over the silicon layer;
d. defining a pattern in said conductive layer;
e. defining a pattern in said silicon layer by plasma etching with freon gas; and
f. homogenizing the remaining silicon and conductive layers into an alloy by heating.

2. The method as defined in claim 1 wherein said insulative layer is silicon dioxide with phosphorus impurities, and said semiconductor substrate is silicon.

3. The method as defined in claim 1 wherein said conductive layer is aluminum.

4. The method as defined in claim 3 wherein the thickness of said layer of silicon is 125 ± 20A and the thickness of said aluminum layer is 1.0 ± .05$\mu$.

5. The method as defined in claim 3 wherein said conductive layer defines a mask for forming said silicon layer.

6. The method as defined in claim 1 wherein the amount of silicon in the silicon layer is chosen to provide just enough silicon to saturate the conductive layer at a selected alloy temperature and be completely consumed in the formation of the alloy.

7. The method as defined in claim 1 wherein said conductive layer is aluminum and wherein said homogenization takes places by heating said remaining layers at 515°C for about 10 minutes.

* * * * *